United States Patent
Penney

(10) Patent No.: US 10,482,946 B2
(45) Date of Patent: *Nov. 19, 2019

(54) MANAGEMENT OF STROBE/CLOCK PHASE TOLERANCES DURING EXTENDED WRITE PREAMBLES

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/448,841

(22) Filed: Jun. 21, 2019

(65) Prior Publication Data

US 2019/0311762 A1 Oct. 10, 2019

Related U.S. Application Data

(63) Continuation of application No. 15/850,744, filed on Dec. 21, 2017, now Pat. No. 10,366,737.

(51) Int. Cl.
*G11C 11/4093* (2006.01)
*G11C 11/4076* (2006.01)
*G11C 11/4096* (2006.01)
*G11C 11/408* (2006.01)

(52) U.S. Cl.
CPC ...... *G11C 11/4076* (2013.01); *G11C 11/4087* (2013.01); *G11C 11/4093* (2013.01); *G11C 11/4096* (2013.01)

(58) Field of Classification Search
CPC ............ G11C 11/4076; G11C 11/4096; G11C 11/4093
See application file for complete search history.

(56) References Cited

U.S. PATENT DOCUMENTS

| | | |
|---|---|---|
| 6,456,544 B1 | 9/2002 | Zumkehr |
| 7,342,838 B1 | 3/2008 | Sharpe-Geisler et al. |
| 9,524,759 B2 | 12/2016 | Nam et al. |
| 10,366,737 B2 * | 7/2019 | Penney ................ G11C 7/1093 |
| 2006/0250861 A1 | 11/2006 | Park et al. |

(Continued)

OTHER PUBLICATIONS

International Search Report and Written Opinion for PCT/US2018/046116 dated Nov. 29, 2018, 13 pages.

*Primary Examiner* — Hoai V Ho
*Assistant Examiner* — Jay W. Radke
(74) *Attorney, Agent, or Firm* — Fletcher Yoder, P.C.

(57) ABSTRACT

Memory devices coupled to host devices may receive clocking signals and data strobe signals during write operations, which may present a skew. Memory specifications may include Write Preambles, preambles in the data signal provided at the beginning of write operations. Memory devices that decode particular features in the preamble, and that may relax the skew tolerances are provided. The memory devices may include configurable decoders that may be adjusted based on the features in the preamble or the preamble type. For example, memory devices may employ a rising edge, a falling edge, a low level, or a high level based on the specific type of preamble. Skew tolerances between the clock and the data strobe signals may be further improved by employing early write command launch points, using a training mechanism.

20 Claims, 5 Drawing Sheets

(56) References Cited

U.S. PATENT DOCUMENTS

| | | |
|---|---|---|
| 2006/0250882 A1 | 11/2006 | Choi et al. |
| 2007/0110205 A1 | 5/2007 | Macri et al. |
| 2014/0126305 A1 | 5/2014 | Vo |
| 2014/0189224 A1 | 7/2014 | Kostinsky et al. |
| 2016/0133309 A1 | 5/2016 | Maryan et al. |
| 2016/0172018 A1 | 6/2016 | Nam et al. |

* cited by examiner

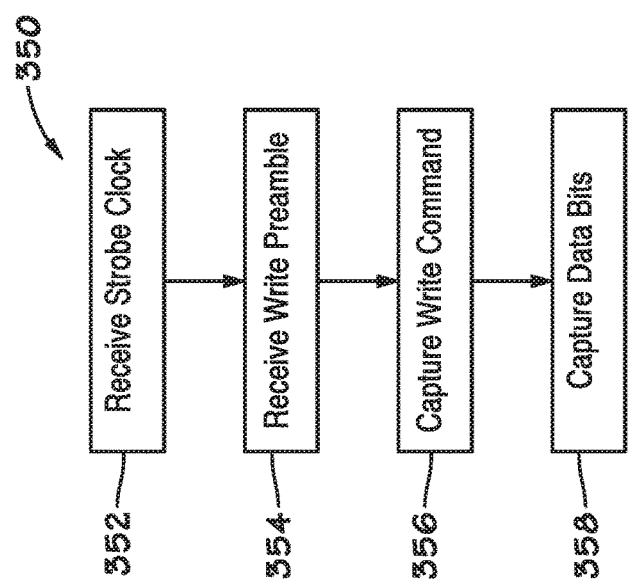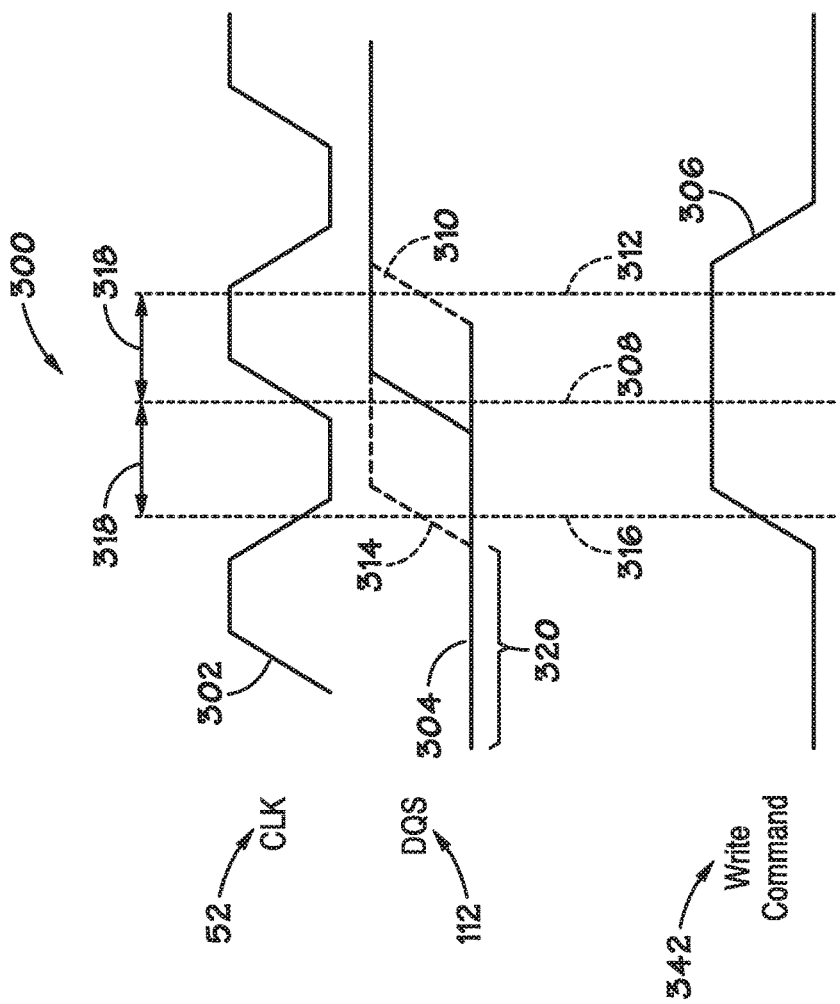

MANAGEMENT OF STROBE/CLOCK PHASE TOLERANCES DURING EXTENDED WRITE PREAMBLES

CROSS REFERENCE TO RELATED APPLICATIONS

This application is a continuation of U.S. application Ser. No. 15/850,744, filed Dec. 21, 2017, entitled "MANAGEMENT OF STROBE/CLOCK PHASE TOLERANCES DURING EXTENDED WRITE PREAMBLES," the entirety of which is incorporated by reference herein for all purposes.

BACKGROUND

1. Field of the Invention

The present disclosure relates to memory devices, and more specifically, to methods that improve phase tolerances between clocking signals and strobing signals using write preambles.

2. Description of the Related Art

Random access memory (RAM) devices, such as the ones used in electronic devices to facilitate data processing and/or provide storage, may provide direct access to addressable data storage cells that form the memory circuitry of the device. Certain RAM devices, such as dynamic RAM (DRAM) devices may, for example, have multiple memory banks having many addressable memory elements. The RAM devices may also have a command interface that may receive addresses and instructions for operations, such as read or write, which may be associated with those addresses. The RAM devices may also include decoding circuitry that may translate the instructions and the addresses into internal commands for accessing the corresponding memory banks.

The data exchanged between the processing circuitry (e.g., host) of an electronic device and the memory device may be accompanied by synchronizing clock signals. As an example, during a write process, the electronic device a may provide writing commands and addresses that may be synchronized with a clock signal, as well as the data to be stored that may be synchronized with a data strobe signal. Therefore, the memory device, which coordinates both the writing commands synchronized to the clock signal and data synchronized to the data strobe signal to perform the write operations, may have a specified tolerance margin for phase differences between the clock signal and the data strobe signal. Moreover, in some systems, the data strobe signal may travel in a bidirectional electrical connection between the host and the memory device and, as result, the strobe clock input/output circuitry may be enabled or disabled at particular times. Satisfying the tolerance margins may be particularly challenging during activation of the strobe clock signals.

BRIEF DESCRIPTION OF THE DRAWINGS

Various aspects of this disclosure may better be understood upon reading the following detailed description and upon reference to the drawings in which:

FIG. 2 is a chart illustrating phase differences and phase difference tolerances between clock and data strobe signals during a write command, in accordance with an embodiment;

FIG. 3 is a flow chart illustrating a method to initialize a write cycle, in accordance with an embodiment;

DETAILED DESCRIPTION OF SPECIFIC EMBODIMENTS

Figure 1:
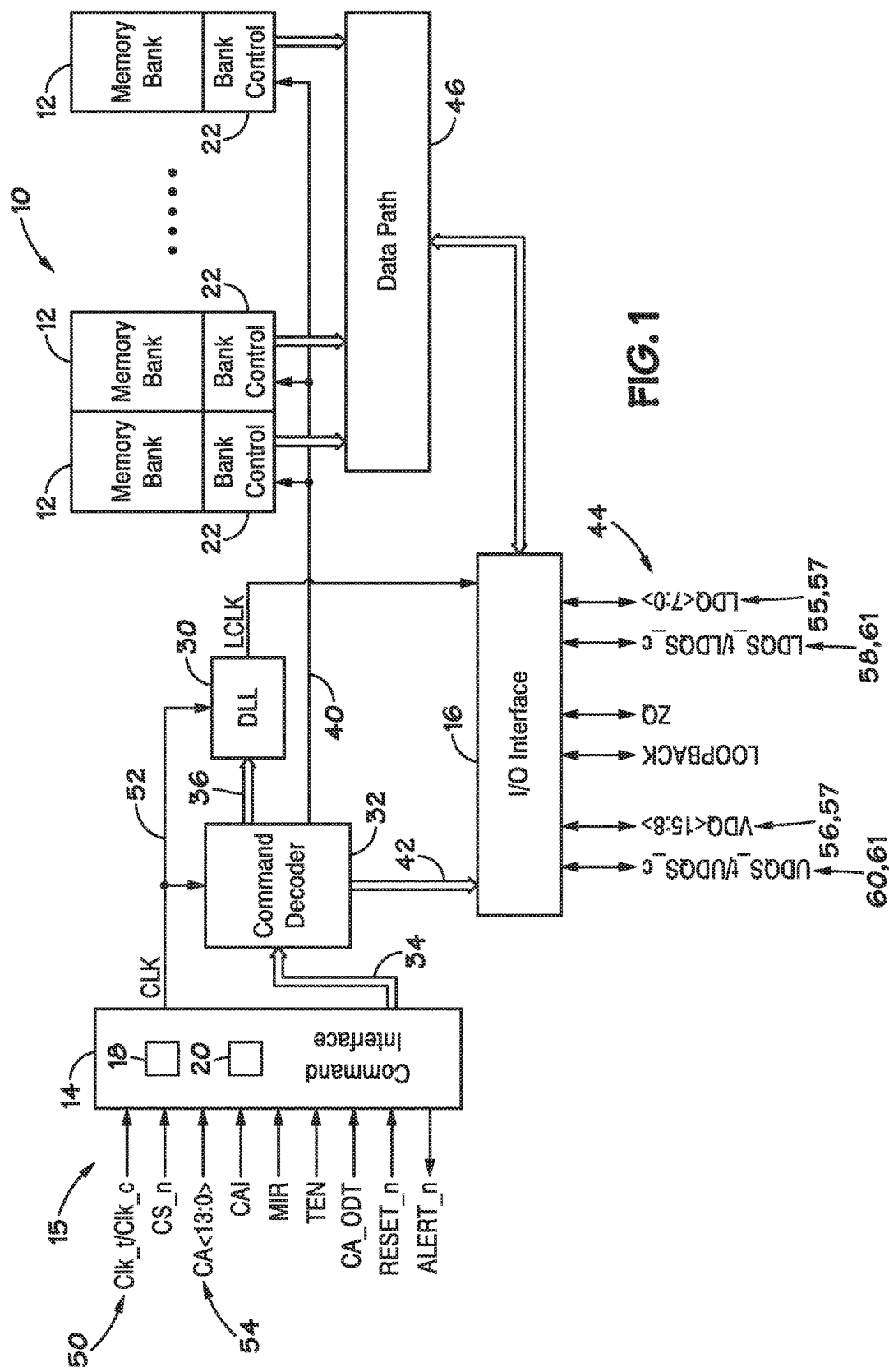
FIG. 1 is a block diagram illustrating an organization of a memory device that may benefit from management of tolerances during write cycle initialization, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems employ random access memory (RAM) devices that may be coupled to processing circuitry (e.g., host), and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the host. Memory devices may also include command circuitry to receive instructions and/or addresses from the host. For example, in double data rate type five (DDR5) SDRAM devices, these instructions and addresses may be provided by the host via a 14-bit command/address (CA) signal. The coupled host may also provide clocking signals to the memory device along with instructions and/or addresses.

In several RAM devices, such as in DDR5 SDRAM devices, the host may provide instructions and/or addresses using an instruction bus CA, which may be synchronized with a clocking signal Clk. In certain situations, such as during a write operation, the host may also provide data using a data bus DQ, which may be synchronized with a data strobe signal DQS (e.g., strobe signal, strobe clock signal) that facilitates capture of data in the DQ bus by the memory device. Both clocking signals provided by the host, the clocking signal Clk and the data strobe signal DQS may have the same frequency and may present a skew (i.e., a phase difference) between them. Since the phase difference may affect the operations of the memory device in situations in which the memory device is performing operations that coordinate both clocking signals, a tolerance gap in the phase difference may be specified.

The data strobe signal DQS may be provided in a bidirectional electrical bus and may be inactive in situations in which the host is not providing data. When the data strobe signal is initiated, such as during the initialization of the write operation, a processor coupled to a DDR5 SDRAM device may provide a CA signal, including the write command and/or address, synchronized with a Clk signal. Following the CA signal that carries the write command, the host may initialize the data strobe signal DQS, and provide data in a data bus DQ synchronized to a data strobe signal DQS. The memory device may use the clock signal to capture the CA signal, and use the clocked CA signal to initialize the circuitry to allow proper capture of the data by the DDR5 SDRAM device.

At the beginning of certain operations (e.g., during a write operation) the host device may initiate the DQS signal, which may have a skew (e.g., a phase difference) relative to the Clk signal. The initialization of DQS signal may also include a defined preamble signal. As discussed above, the write command may be synchronized with the Clk signal, whereas the data may be synchronized with the DQS signal. As a result, the skew may create a challenge for the memory device to capture the first bits of data in a write cycle. The present application describes methods and systems that may employ preambles in the DQS signal to adequately adjust the circuity for arrival of the initial bits of data. In certain embodiments, the features in the preamble may be used for capturing the first bit in a write cycle. Since processing the CA signal may lead to some latency, the use of preambles of the DQS signal to facilitate the initialization of the writing process may lead to a reduced general latency. In certain embodiments, signal training may be used to adjust launch points for a write command. Embodiments, generally, allow a robust initialization of writing cycles by increasing the clock skew tolerances (e.g., $t_{DQSS}$) for write cycles.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from an external device or host, such as a processor or controller. The processor or controller may provide various signals 15 to the memory device 10 to facilitate the transmission and receipt of data to be written to or read from the memory device 10. As will be appreciated, the command interface 14 may include a number of circuits, such as a clock input circuit 18 and a command/address input circuit 20, for instance, to ensure proper handling of the signals 15. The command interface 14 may receive one or more clock signals from an external device. Generally, double data rate (DDR) memory utilizes a differential pair of system clock signals 50, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal 52.

The clock input circuit 18 receives the differential pair of clock signals 50 and generates an internal clock signal CLK 52. The internal clock signal CLK 52 is supplied to an internal clock generator 30, such as a delay locked loop (DLL) circuit. The internal clock generator 30 generates a phase controlled internal clock signal LCLK based on the received internal clock signal CLK 52. The phase controlled internal clock signal LCLK is supplied to the I/O interface 16, for instance, and may be used as a timing signal for determining an output timing of read data or generates a capture window of write data.

The internal clock signal CLK 52 may also be provided to various other components within the memory device 10 and may be used to generate various additional internal clock signals. For instance, the internal clock signal CLK 52 may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK.

The command decoder 32 may also decode commands, such as read commands, write commands, and activate commands and provide instructions to the I/O interface 16 via I/O bus 42 to regulate the flow of data between the data path 46 and the circuitry external to the memory device. For example, when the CA signal 54 indicates a write command or operation, the command decoder 32 may provide a write command to the I/O interface 16 over bus 42 that indicates that the I/O interface 16 may receive data to be stored. Further, the command decoder 32 may, based on the decode commands, provide access to a particular memory bank 12 corresponding to the command and/or address, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and writes commands, based on the command/address signals 54 received from an external device, such as a processor. In one embodiment, the command/address bus may be a 14-bit bus to accommodate the command/address signals 54 (CA<13:0>). The command/address signals 54 are clocked to the command interface 14 using the differential pair of clock signals 50, as discussed above. The command interface may include a command/address input circuit 20 which is configured to receive and transmit the commands to provide access to the memory banks 12, through the command decoder 32. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals 54 CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing. The command interface 14 may also be used to provide an alert signal (ALERT_n) to the system processor or controller for certain errors that may be detected. For instance, an alert signal (ALERT_n) may be transmitted from the memory device 10 if a cyclic-redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals 57, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> or upper DQ signal 56, DQ<7:0> or lower DQ signal 55) corresponding to upper and lower bytes of the data signals, for instance.

To allow for higher data rates within the memory device 10, certain memory devices, such as DDR memory devices may utilize data strobe signals, generally referred to as DQS signals 61. As discussed above, the DQS signals 61 are driven by the external processor or controller sending the data (e.g., for a write command) or by the memory device 10 (e.g., for a read command). For read commands, the DQS signals 61 are effectively additional data output (DQ) signals with a predetermined pattern. For write commands, the DQS signals 61 are used as clock signals to capture the corresponding input data. As with the clock signals 50 (Clk_t and Clk_c), the data strobe (DQS) signals 61 may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c 60; LDQS_t and LDQS_c 58) corresponding to upper and lower bytes of data sent to and from the memory device 10, for instance. In the present disclosure, DQ signals 57 such as UDQ signal 56 or LDQ signal 55 may be generally referred to as XDQ signal 57. Similarly, strobing signals such as UDQS signals 60 and LDQS signals 58 may be generally referred to as XDQS signal 61.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the 10 interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16. As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

A write command sent by a host to a memory device via the CA signal 54 may be processed by the input circuitry 20 and the command decoder 32 and, as a result, may arrive at the I/O interface 16 through bus 42 with some latency, which may be a Column Access Strobe (CAS) Write Latency (CWL). The schematic timing diagram 300 illustrated in FIG. 2 provides an illustration of the time relationship between the Clk signal 52, and the DQS signal 112, as well as with respect to the CWL-delayed write command 342, during initialization of a write cycle. The timing diagram also illustrates the skews between the Clk signal 52 and the DQS signal 112. Curve 302 may correspond to a received clock signal 52, curve 304 may correspond to a received data strobe 112 during the beginning of the write cycle, and curve 306 may schematically represent the availability of the write command 342 at the beginning of the write cycle. The first edge in the curve 304 may be measured relative to the rising edge of the clock signal in curve 302 at time 308. The memory device 10 may receive the first rising edge of the data strobe 112 as late as at time 312 (e.g., edge 310) or as early as at time 316 (e.g., edge 314). The allowable range of skews may be described as a tolerance margin, $t_{DQSS}$ 318, and may be specified by the memory standard such as the DDR5 specification. Note that, as represented by curve 306, the write command 54 may be provided synchronous with the Clk curve 302.

The timing diagram 300 also illustrates a write preamble (WPre) period 320 prior to the first edge of the DQS, which may appear in the beginning of the write data burst. As discussed above, prior to receiving the write command, the data strobe 112 received by the memory device 10 may be undriven or undefined. Following the reception of the CA signal 306 containing the write command, the host may drive the data strobe line 112 to a fixed level (e.g., a low voltage level) and/or provide a preamble during the WPre period 320. The WPre period 320 may last for a fixed number of cycles. As detailed above, some preambles may have 1 cycle, 2 cycles, 3 cycles, or any other number of cycles specified by a memory specification. Following the pre-amble, the edges of the DQS signal 112 may be used to capture data in the DQ bus (e.g., XDQ signal 57 in FIG. 1). In the illustrated example, the first bit in the DQ bus may arrive synchronized with the rising edge of the DQS curve 304. Note that, due to the $t_{DQSS}$ tolerance margins, the CWL-delayed write command 342, indicated by the high-level in curve 306, may arrive after the rising edge of DQS curve 304. In the example, if the rising edge of the DQS curve 304 arrives at time 316, prior to the high-level in curve 306, the CWL-delayed write command 342 may not be available, resulting in a system that fails to capture first bit. As disclosed herein, the preamble in the WPre period 320 may be used in the I/O interface 16 to prepare the circuitry for capture and storage of the write command and data bits for storage, and prevent faults described herein from occurring.

As discussed above, the host device may provide a write command and an address over the command/address signal 54, synchronized by a clocking signal 52. Input circuitry 20 and/or command decoder 32 may provide the write command 342. Following these operations, the host may initialize driving a DQS signal in the bidirectional DQS bus. During the initialization, the host may provide an initial fixed level followed by a preamble. The specific shape of the preamble may be determined based on instructions contained in the write command, or via an instruction received during an initial handshake between the memory device and the host. Following the preamble, the host may provide data in the data bus (e.g., DQ bus), which may be synchronized to a data strobing clock signal in the DQS bus.

The flow chart 350 in FIG. 3 illustrates a method that may be used by the I/O interface 16, in the memory device, to process the above discussed signals during initialization of the data writing operation. In a process 352, the I/O interface may begin receiving an input in the bidirectional DQS bus (e.g., XDQS 61). In a process 354, the memory device may receive the preamble during the WPre period 320. As discussed in more detail below, the memory device may seek particular features of the preamble, and may use the features to prepare the circuitry to capture the first bit. Examples of features include a rising edge, a falling edge, a high logic level, and a low logic level. In a process 356, the detected feature may be used to capture the CWL-delayed write command 342 and/or to trigger the I/O circuitry to receive the first data-bit using the next upcoming edge in the DQS signal. Note that by using the preamble, in process 354, the effect of the latency in processing the write command in the command interface 14 and/or command decoder 32 may be mitigated, reducing overall write latencies during data storage. Following the capture of the CWL-delayed write command 342, the I/O interface may begin capturing data bits using the edges of the DQS signal to clock the data capture, in process 358.

Figure 4A:
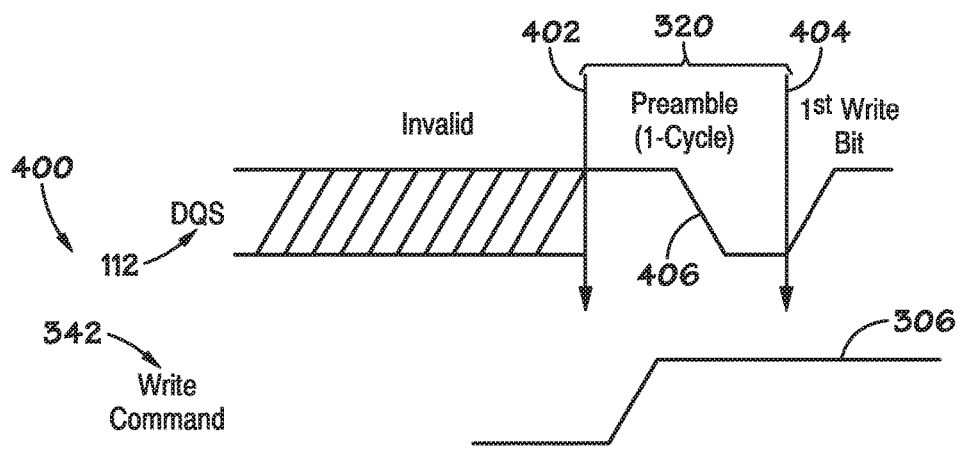
FIG. 4A is a chart illustrating a 1-cycle preamble that may be used during initialization of a write cycle, in accordance with an embodiment.
Figure 4B:
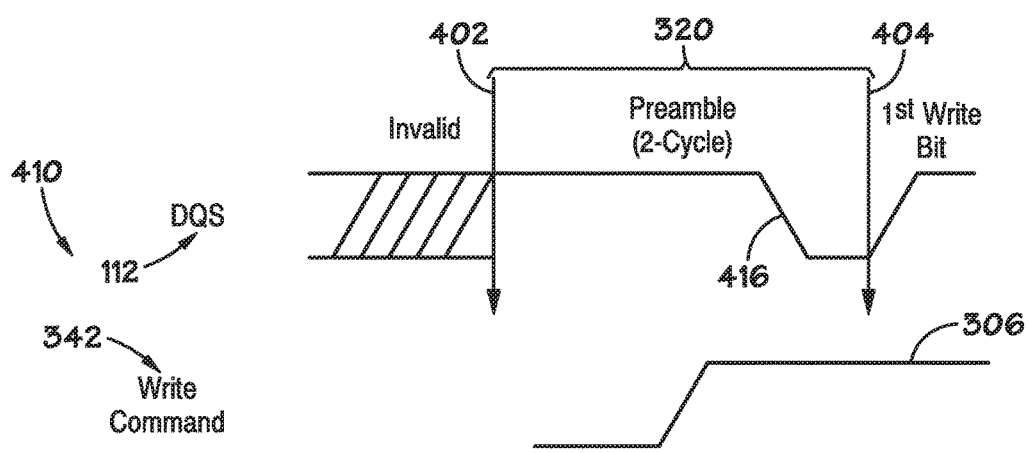
FIG. 4B is a chart illustrating a 2-cycle preamble that may be used during initialization of a write cycle, in accordance with an embodiment.
Figure 4C:
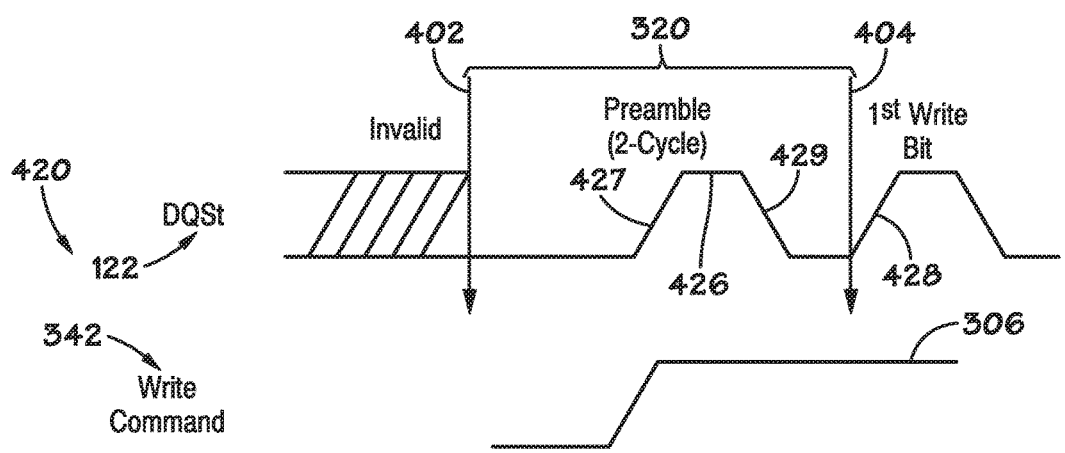
FIG. 4C is a chart illustrating another 2-cycle preamble that may be used during initialization of a write cycle, in accordance with an embodiment.

As discussed above, the DQS signal may include a WPre period 320, which may include a preamble. FIGS. 4A, 4B, and 4C illustrate in time charts 400, 410, and 420, the preambles 406, 416, and 426, which may be used by the input circuitry to prepare for capturing the first data bit. In preambles 406, 416, and 426, the preamble may be provided during the WPre period 320, as discussed above, following the beginning of driving the DQS signal, at time 402, and before the arrival of the first bit, at time 404. In the illustrated time charts 400, 410, and 420, the descriptions may be associated with the "true" value of the DQS signal 112. While descriptions associated with the "complement" value of the DQS signal 112 are omitted in these figures, systems and methods that employ the "complement" value may be obtained by proper adjustment of the systems and methods described herein, as understood in the art.

Time chart 400 in FIG. 4A describes a 1-cycle preamble 406. In the WPre period 320, the DQS signal 112 may be set to a high logic level for half-cycle and go to a low level for half-cycle. In such situation, the input circuitry may trigger the input circuitry to capture the write command 342 and the first write bit at the first rising edge that follows the first dropping edge in the WPre period 320. With that strategy, the memory device may present a $t_{DQSS}$ of up to ½ clock cycle as the write command 342 may arrive any time before time 404. Preamble 406 may be used by memory standards including DDR4 and/or DDR5.

Time chart 410 in FIG. 4B describes a 2-cycle preamble 416. In the WPre period 320, the DQS signal 112 may be set to a high logic level for one cycle and a half and go to a low level for half-cycle. In such situation, the input circuitry may trigger the input circuitry to capture the write command 342 and the first write bit at the first rising edge that follows the first dropping edge in the WPre period 320. With that strategy, the memory device may present a $t_{DQSS}$ of up to 1 clock cycle as the write command 342 may arrive any time before time 404. Preamble 416 may be used by memory standards including the DDR4. Note that this strategy may be substantially similar as that used to process preamble 406, and as a result, a memory device compatible with DDR4 may use the same strategy when processing the 1-cycle preamble 406 and/or the 2-cycle preamble 416.

Time chart 420 in FIG. 4C describes another 2-cycle preamble 426. In the WPre period 320, the DQS signal 112 may be set to a low logic level for one cycle, to a high logic level for half a cycle, and back to a low logic level for half-cycle. Notice that, as preamble 426 includes a rising edge 427, the write command 342 may arrive before the first rising edge 427 or after the rising edge 427. As such, if the $t_{DQSS}$ is higher than ½ clock cycle, the processing circuitry in the memory device may be incapable of differentiating the rising edge 427 and the 1st-bit rising edge 428. By contrast, a strategy that uses the first falling edge 429 may allow a tolerance margin in the $t_{DQSS}$ of 0.75 clock cycles. Thus, by triggering the input circuitry to capture the write command 342 in the first falling edge 429, and capturing the first write bit at the following rising edge 428 in the WPre period 320, the memory device may relax the $t_{DQSS}$ tolerance. Preamble 426 may be used by memory standards, including the DDR5 standard. As a result, a memory device compatible with DDR5 may employ different strategies based on the length of the preamble, as detailed below.

Figure 5:
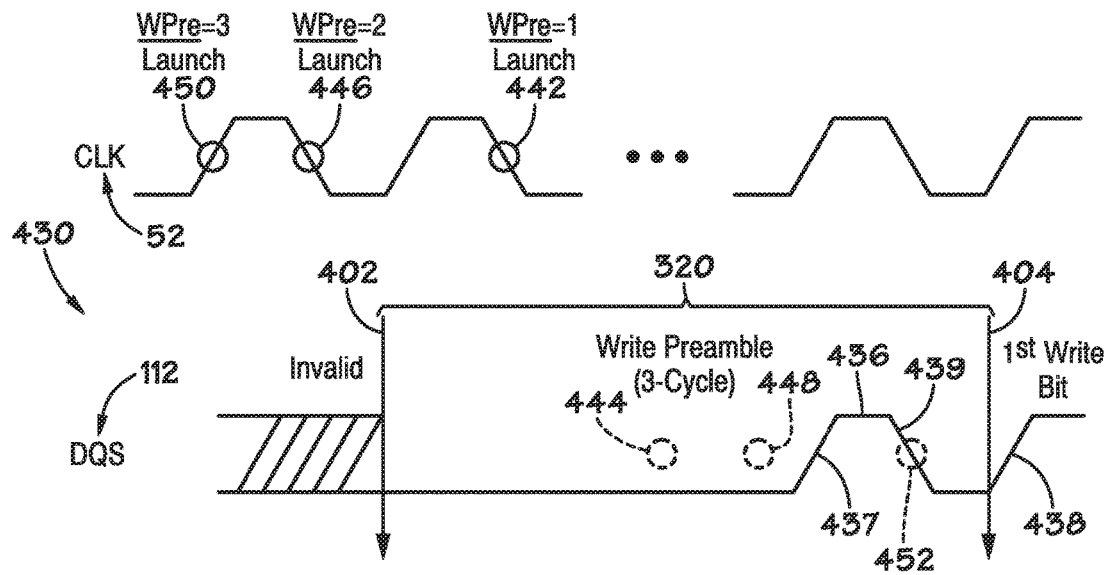
FIG. 5 is a chart illustrating launch points that may be used by a memory device that manages tolerances during write cycle initialization, in accordance with an embodiment.

Time chart 430 in FIG. 5 describes a 3-cycle preamble 436, which may be used in a memory standard such as the DDR5 standard. In the WPre period 320, the DQS signal 112 may be set to a low logic level for 2 cycles, to a high logic level for half a cycle, and back to a low logic level for half-cycle. As discussed with respect to preamble 426, as the write command 342 may arrive before or after the rising edge 437, and as a result the $t_{DQSS}$ may be limited to ½ clock cycle if the memory device employs the rising edge as a trigger to capture the write command 342. Thus, as with the 2-cycle preamble 426, in the 3-cycle preamble 436, a strategy using the falling edge 437 may allow an increase in the tolerance margin to 0.75 clock cycles. To that end, the input circuitry may be triggered to capture the write command 342 in the first falling edge 439, and the first write bit at the following rising edge 438.

The time chart 430 in FIG. 5 also illustrates a relationship between the launch edge of for the write command 342, and the corresponding center of the tolerance windows for the write command. In the illustration, the 1-cycle write preamble 416 may be launched at edge 442, and the associated write command may be centered at time 444. The 2-cycle write preamble 436 may be launched at edge 446, and the associated write command may be centered at time 448. The 3-cycle preamble 437 may be launched at the edge 450, and the associated write command may be centered at time 452. By employing the above described launch edges in the internal timings of the memory device, a more relaxed $t_{DQSS}$ may be obtained.

Figure 6:
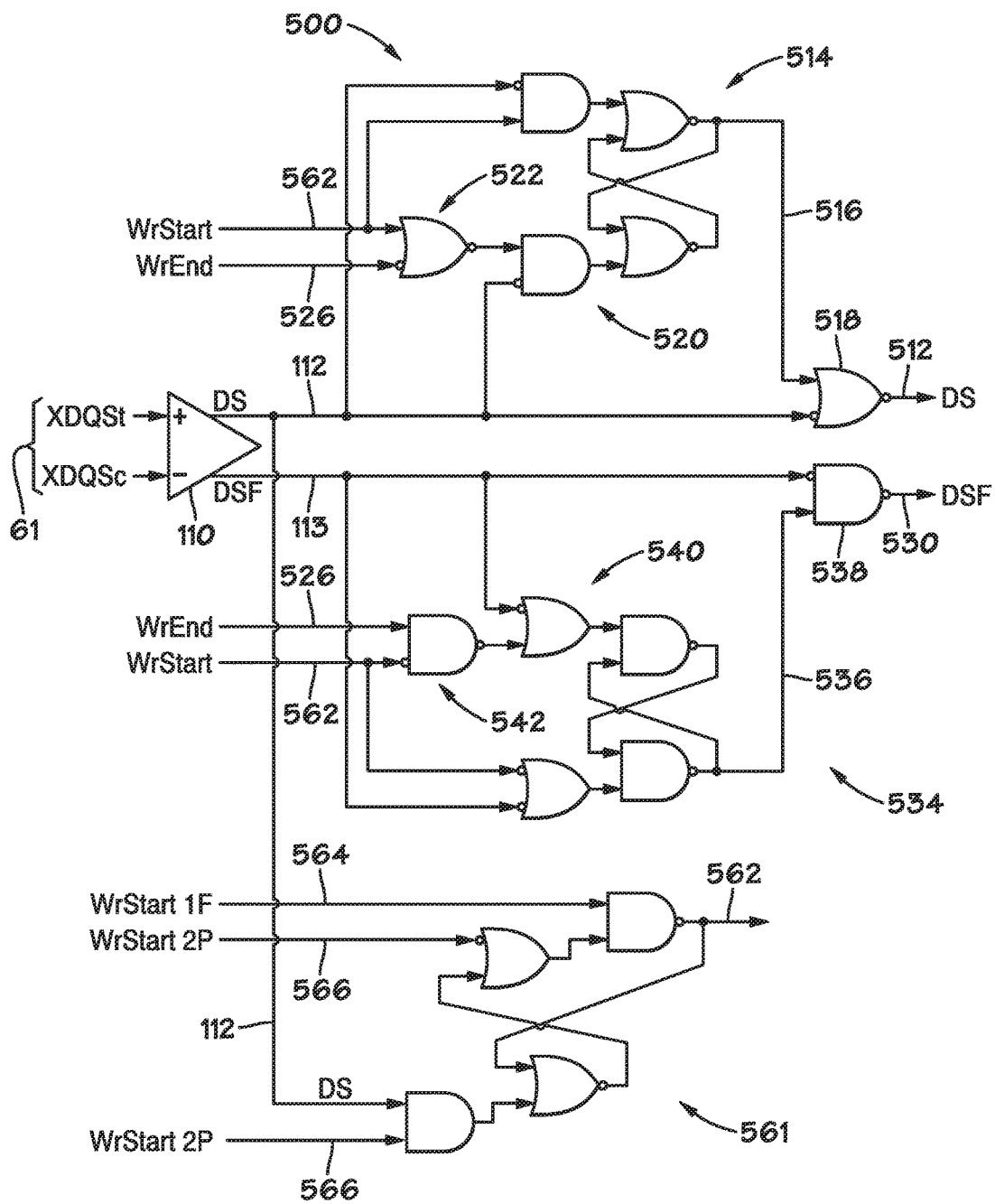
FIG. 6 is a block diagram illustrating a schematic circuit for generating instructions for a configurable preamble decoder for initialization of a write cycle, in accordance with an embodiment.

The schematic block diagram in FIG. 6 illustrates an implementation of input circuitry 500 that may be used to decode and/or process the preamble in the DQS signal based on the type of preamble received, and initialize a write operation, as discussed above. The input circuitry 500 may receive the data strobe pair 61, and may provide gated data strobe outputs DS 512 and DSF 530, which may be used by the memory device to perform the DQ capture. The input circuitry 500 may begin providing the gated strobe outputs DS 512 and DSF 530 after decoding the preamble, and may cease to provide the gated strobe outputs DS 512 and DSF 530 prior after receiving a write end command 526. As discussed above, in certain memory devices such as DDR5 devices, the strategy for preamble decoding may be different based on the preamble used. Thus, the input circuitry 500 may receive two different write start commands, the write start command for 1-cycle preambles (WrStart 1F) 564 and/or the write start command for 2- and 3-cycle preambles (WrStart 2P) 566. Input circuitry 500 may have latch circuitries 514 and 534, which may operate as level-sensitive slave latches, and the latch circuitry 561, that may operate as edge sensitive master latch to slave latch circuitries 514 and 534. It should be noted that write start command provided may be based on the configuration of the data transmission mode, and may take place in configuration circuitry within the command decoder 32.

The SR latch circuitry 561 may process the write start command for 1-, 2-, and 3-cycle preambles, which may be preambles 406, 426, and 436 respectively. Latch circuitry 561 may receive a WrStart1F signal 564, which may indicate a 1-cycle preamble (e.g., a WPre1 preamble) and a WrStart2P signal 566, which may indicate a 2- or a 3-cycle preamble (e.g., WPre2 preamble or WPre3 preamble). Based on the WrStart1F signal 564 and the WrStart2P signal 566, and on the data strobe signal 112, the latch circuitry 561 may provide the trigger signal WrStart signal 562. In the illustrated circuitry, WrStart1F signal 564 may be set to logic true, and the WrStart2P signal 566 to logic false, prior to receiving the preamble.

When the memory device receives the 1-cycle preamble, the WrStart 1F 564 signal may be set to logic false and WrStart2P signal may stay in logic false. In this situation, the latch circuitry 561 may be bypassed and the WrStart signal 562 may be triggered immediately. As a result, the latch circuitries 514 and 534 may be provide the gated signals 512 and 530 as triggered by the edge of the ungated data strobe signals 112 and 113, respectively. As a result, the input circuitry 500 operates as a level-sensitive latch. When the memory device receives the 2- or the 3-cycle preamble, the WrStart 2P signal 566 may be set from logic false to logic true and the WrStart 1F stays in the logic true. In this situation, the latch circuitry 561 triggers latches 514 and 534 by asserting WrStart 562 after the data strobe signal 112 is high. As a result, the input circuitry 500 operates as an edge-sensitive master/slave latch. Thus, latch circuitry 561 may, based on the preamble, configure the trigger for the gating performed in latches 514 and 534 to receive the first data bit in a configurable manner, and provide more relaxed $t_{DQSS}$ specifications.

The latch circuitry 514 may process the incoming WrStart signal 562 and control gate 518. The latch circuitry 514 may receive the write command 562 and clock it based on the data strobe signal 112 to produce a gating enable signal 516. As a result, gating enable signal 516 may be provided after the first falling edge that follows the trigger WrStart signal 562. The gating enable signal 516 may be used to gate the data strobe signal 112 in the gate 518 (e.g., NOR gate) to produce the gated data strobe signal 512. The latch circuitry 514 may include a latch 520 that is clocked by the data strobe signal 112. The input of the latch circuitry 514 may include a logic 522 which may combine the WrStart signal 562 and the write end command 526 to allow initiation of operations at the beginning of the write cycle and interruption of operations at the end of the write cycle.

Similarly, the latch circuitry 534 may process the incoming WrStart signal 562 and control gate 538. The latch circuitry 534 may receive the WrStart signal 562 and clock it based on the data strobe complement 113 to produce a second gating enable signal 536. As a result, the second gating enable signal 536 may be provided after the first falling edge that follows the WrStart signal 562. The gating enable signal 536 may be used to gate data strobe complement 113 in the gate 538 (e.g., a NAND gate) to produce the gated data strobe complement 530. The latch circuitry 534 may include the latch 540 that is clocked by the data strobe complement 113. The input of latch circuitry 534 may include a logic 542 which may combine the write command 42A and the write end command 526 which may allow initialization and/or interruption of the write cycle.

Figure 7:
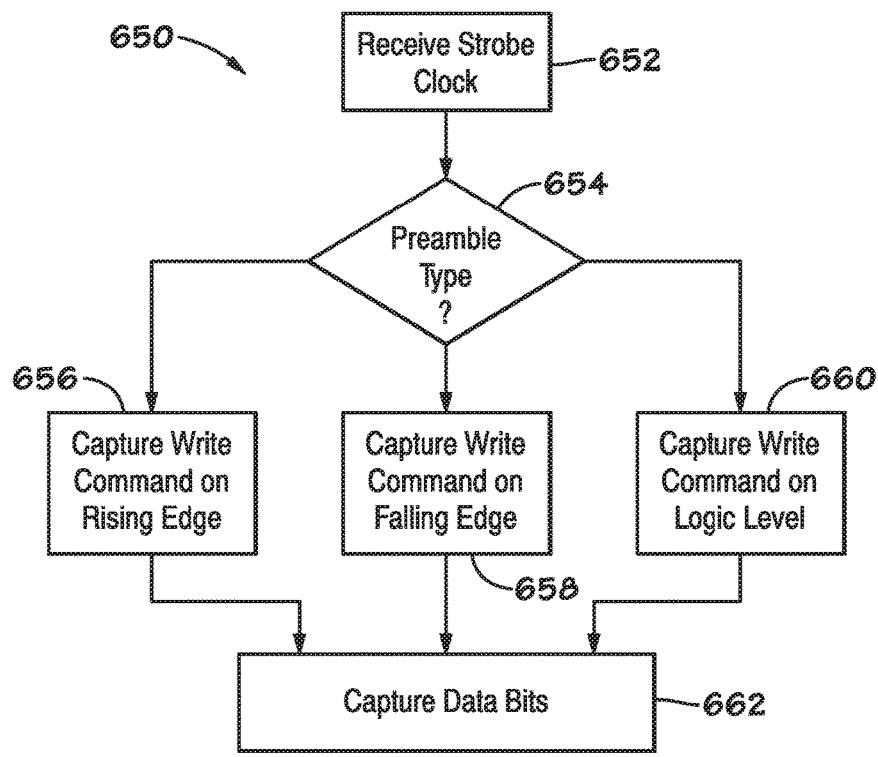
FIG. 7 is a flow chart illustrating a method to initialize a write cycle using a configurable preamble decoder, in accordance with an embodiment.

It should be noted that the above-described strategy may be implemented using similar circuitry that decode preambles in the configurable manner described by input circuitry 500. The flow chart 650 in FIG. 7 describes a method for input circuitry in memory devices to detect preambles features in a configurable manner, which may be used to obtain relaxed $t_{DQSS}$ using the discussed strategies. In block 552, the memory device may begin receiving the strobe clock associated with a write cycle. The memory device may be configured to expect a specific preamble, based on the specifications for the memory device, as discussed above. Decision block 654 may configure the input circuitry to seek the particular feature. The features may include a rising edge (block 656), a falling edge (block 658) or a logic true or false (block 660). For example, in a DDR5 device, the memory device may seek a low level in a 1-cycle preamble (e.g., block 660), or a falling edge in a 2- or a 3-cycle preamble (e.g., block 658). After decoding the preamble, the input circuitry may be triggered to capture the first data bit at the first rising edge of the data strobe signal (block 662).

Embodiments of the methods and systems described herein may be used to increase the reliability and decrease latencies in the response of electronic devices (e.g., memory devices) coupled to a host, in which the device's input circuitry may be subject to metastability effects. Certain methods may also employ adjustments to delays during a signal training stage to cause adjustments to the host. Systems described herein may employ logic that provides a valid input from an undriven input, which prevents the input circuitry from entering the metastability state. The embodiments may employ signal training methods to cause a host to advance and/or delay a particular signal in view of the adjustment of the input circuitry to metastability. As a result of the implementation of the methods and systems, the initialization of processes (e.g., a write burst) between the electronic device and the host may present reduced latency without data corruption.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device comprising circuitry configured to:
receive a preamble signal associated with a first preamble of a plurality of preambles;
receive a data strobe signal;
receive a write command signal;
capture a preamble feature of the data strobe signal based on the preamble signal, wherein the preamble feature comprises a rising edge, a falling edge, a high logic value, a low logic value, or a first combination thereof; and
capture a first bit of a data signal based on a data strobe feature that follows the preamble feature, wherein the data strobe feature comprises the rising edge, the falling edge, the high logic value, the low logic value, or a second combination thereof.

2. The memory device of claim 1, wherein the plurality of preambles comprises a 1-cycle preamble, a 2-cycle preamble, and a 3-cycle preamble.

3. The memory device of claim 2, wherein the memory device comprises a DDR5 SDRAM device, and wherein a first preamble feature associated with the 1-cycle preamble comprises the low logic value and wherein a second preamble feature associated with the 2-cycle preamble and the 3-cycle preamble comprises the falling edge.

4. The memory device of claim 1, wherein the data strobe feature comprises the rising edge that follows the preamble feature.

5. The memory device of claim 1, wherein the circuitry comprises:
feature detection circuitry configured to receive the data strobe signal, and a selection signal that comprises the preamble signal, and to provide a trigger signal based on the preamble feature; and
gating circuitry configured to receive the data strobe signal and the trigger signal, and provide a gated data strobe signal based on the trigger signal and the data strobe feature.

6. The memory device of claim 5, wherein the feature detection circuitry comprises an SR latch.

7. The memory device of claim 5, wherein the selection signal comprises a first signal associated with a 1-cycle preamble and a second signal associated with a 2-cycle preamble, a 3-cycle preamble, or any combination thereof.

8. The memory device of claim 5, wherein the gating circuitry comprises:
a gating latch configured to receive the data strobe signal, the trigger signal, and a write end command, and to provides a gate enable signal; and
a gate configured to receive the data strobe signal and the gate enable signal and to provide the gated data strobe signal.

9. The memory device of claim 1, wherein the write command signal comprises an address.

10. The memory device of claim 1, wherein the memory device is configured to receive a clock signal that clocks the write command signal, and wherein the memory device is configured to comprise a skew tolerance between the clock signal and the data strobe signal.

11. The memory device of claim 10, wherein the skew tolerance comprises 1 clock cycle when the data strobe signal comprises the first preamble of the plurality of preambles and 0.75 clock cycle when the data strobe signal comprises the second preamble of the plurality of preambles.

12. A memory device comprising circuitry configured to:
receive a latency-delayed write signal and to provide a preamble selection signal, wherein the preamble selection signal indicates a preamble type of a set of preamble types that comprise a first preamble type and a second preamble type;
receive a data strobe signal;
detect a preamble feature in the data strobe signal, wherein the preamble feature is based on the preamble selection signal; and
provide a trigger signal based on the detection of the preamble feature; and
provide a gated data strobe signal, based on the trigger signal.

13. The memory device of claim 12, wherein the circuitry is configured to detect a first low logic voltage upon receiving the first preamble type, and to detect a first falling edge upon receiving the second preamble type.

14. The memory device of claim 12, wherein circuitry is configured to receive a write end signal.

15. The memory device of claim 12, wherein the memory device is configured to receive a differential strobe signal and to provide the data strobe signal.

16. The memory device of claim 12, comprising a double data rate type 5 (DDR5) synchronous dynamic random access memory (SDRAM) device.

17. A memory device comprising circuitry configured to:
receive a signal associated with a preamble type from a host;
receive a data strobe signal on a bidirectional data strobe bus, wherein the data strobe signal comprises a preamble corresponding to the preamble type;
detect at least one feature of the preamble based on the preamble type; and
capture a first bit of the data at a specific edge of the data strobe signal that follows the at least one feature of the preamble, the specific edge being based on the preamble type.

18. The memory device of claim 17, wherein the circuitry is configured to capture a write command upon detecting the feature.

19. The memory device of claim 17, wherein the at least one feature comprises a rising edge, a falling edge, a logic true, a logic false, or any combination thereof.

20. The memory device of claim 17, wherein the preamble comprises a double data rate type 5 (DDR5) preamble.

* * * * *